US 6,703,283 B1

(12) United States Patent
Ballantine et al.

(10) Patent No.: US 6,703,283 B1
(45) Date of Patent: Mar. 9, 2004

(54) DISCONTINUOUS DIELECTRIC INTERFACE FOR BIPOLAR TRANSISTORS

(75) Inventors: Arne W. Ballantine, South Burlington, VT (US); Douglas D. Coolbaugh, Essex Junction, VT (US); Jeffrey Gilbert, Winooski, VT (US); Joseph R. Greco, South Burlington, VT (US); Glenn R. Miller, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/244,958

(22) Filed: Feb. 4, 1999

(51) Int. Cl.[7] .............................................. H01L 21/331
(52) U.S. Cl. ...................... 438/309; 438/313; 438/318; 438/48; 438/312; 438/205; 438/235; 257/197; 257/351; 257/361; 257/370; 257/373; 257/474; 257/477; 257/526; 257/541; 257/552; 257/565
(58) Field of Search .......................... 257/47, 83, 183, 257/186, 197, 198, 351, 361, 370, 373, 378, 423, 427, 474, 477, 479, 525, 526, 541, 542, 552, 555, 556–559, 565–570, 577, 589; 438/312, 309

(56) References Cited

U.S. PATENT DOCUMENTS

| | | | |
|---|---|---|---|
| 3,709,726 A | 1/1973 | Nuttall | |
| 3,765,935 A | 10/1973 | Rand et al. | |
| 4,363,868 A | 12/1982 | Takasaki et al. | |
| 4,992,306 A | 2/1991 | Hochberg et al. | |
| 5,140,299 A | * 8/1992 | Andrews et al. | 338/308 |
| 5,194,926 A | * 3/1993 | Hayden | 257/565 |
| 5,260,236 A | 11/1993 | Petro et al. | |
| 5,468,974 A | 11/1995 | Aronowitz et al. | |
| 5,578,856 A | * 11/1996 | Subrahmanyan et al. | 257/378 |
| 5,587,344 A | 12/1996 | Ishikawa | |
| 5,620,910 A | * 4/1997 | Teramoto | 438/151 |
| 5,723,368 A | 3/1998 | Cho et al. | |
| 5,723,895 A | * 3/1998 | Takahashi | 257/499 |
| 5,736,425 A | * 4/1998 | Smith et al. | 438/778 |
| 5,744,399 A | 4/1998 | Rostoker et al. | |
| 5,759,904 A | 6/1998 | Dearnaley | |
| 5,763,922 A | 6/1998 | Chau | |
| 5,789,310 A | 8/1998 | Pramanick et al. | |
| 5,827,769 A | * 10/1998 | Aminzadeh et al. | 438/305 |
| 6,228,693 B1 | * 5/2001 | Mackawa et al. | 438/166 |

FOREIGN PATENT DOCUMENTS

| | | |
|---|---|---|
| JP | 59-220969 | 12/1984 |
| JP | 64-017444 | 1/1989 |
| JP | 01-160051 | 6/1989 |
| JP | 02-265246 | 10/1990 |
| JP | 03-250737 | 11/1991 |
| JP | 04-014837 | 1/1992 |
| JP | 04-152533 | 5/1992 |
| JP | 04-321231 | 11/1992 |
| JP | 08-316476 | 11/1996 |
| JP | 10-083995 | 3/1998 |
| JP | 10-335716 | 12/1998 |

OTHER PUBLICATIONS

U.S. patent application Ser. No. 09/165,946, filed Oct. 2, 1998.

* cited by examiner

*Primary Examiner*—Long Pham
*Assistant Examiner*—Wai-Sing Louie
(74) *Attorney, Agent, or Firm*—Connolly Bove Lodge & Hutz; William D. Sabo

(57) ABSTRACT

A process for forming at least one interface region between two regions of semiconductor material. At least one region of dielectric material comprising nitrogen is formed in the vicinity of at least a portion of a boundary between the two regions of semiconductor material, thereby controlling electrical resistance at the interface.

36 Claims, 4 Drawing Sheets

DISCONTINUOUS DIELECTRIC INTERFACE FOR BIPOLAR TRANSISTORS

FIELD OF THE INVENTION

The present invention relates to a boundary layer to be formed between two regions of a semiconductor device structure. In particular, the present invention relates to a semiconductor device structure that includes at least one region of dielectric material between two regions of semiconductor material. The present invention also relates to process for forming such structures.

BACKGROUND OF THE INVENTION

FIG. 1 illustrates an example of a NPN bipolar transistor. The transistor illustrated in FIG. 1 includes a contact 1. The contact 1 may be made of a semiconductor material, such as polycrystalline silicon.

The contact 1 is formed over a region of a substrate 3 at a location where an emitter 5 of the transistor has been formed. A layer 7 of a dielectric material may be arranged on the substrate between the emitter 5 and the contact 1. Often, the dielectric material of the layer 7 is an oxide.

Below emitter 5 lies the base region 9 of the transistor. Below region 9 lies collector 11. FIG. 1 also illustrates the doping and flow of current within an NPN bipolar transistor.

Under normal bias conditions, or forward active mode, the emitter-base (E-B) junction is forward biased, 5 and 9 in FIG. 1, and the collector base junction, 11 and 9 in FIG. 1. is reversed biased. Electrons are ejected from the emitter into the base. Then, the electrons diffuse across the base region where they are swept across the reverse biased C-B junction into the collector. The collector current $I_C$ is associated with the flows of electrons from the emitter. On the other hand, the base current $I_B$ is a function of the holes ejected from the base region. The holes can either recombine in the single crystal emitter or flow into the polysilicon emitter region 1, which is usually highly doped polycrystalline silicon.

The current again, beta (β), may be described by the relationship between the collector current and base current. Beta is defined as (collector current)/(base current). In other words, beta equals $I_C/I_B$. Generally, the desired value of beta is 100.

Resistance created by dielectric material of region 7 may affect the base current, as shown in FIG. 2. Along these lines, as the resistance created by the region between the contact 1 and the emitter 5 increases, base current decreases and, thus, beta increases. In contrast, if the resistance of region 7 is low, the resulting base current is high and, thus, beta is low.

Controlling the dielectric thickness in region 7 for a bipolar transistor typically is critical to controlling the current gain, beta.

Typically, two processes have been used for depositing polycrystalline (polysilicon) on the emitter Si in the past. According to the first process, a horizontal CVD polysilicon deposition tube has been used extensively. The polysilicon is deposited on the single crystalline Si emitter after the single crystalline Si has been precleaned. In this case, dielectric region 7 may be thin since the only oxidation that occurs in region 7 in the transistor illustrated in FIGS. 1 and 2 is that which occurs as the wafers enter the horizontal CVD tube. In this case, residual oxygen trapped in the system when the wafers are loaded may react with the emitter Si at insert temperatures of approximately 625° C. It has been found that very little oxidation of the emitter Si occurs in this instance. The resulting polysilicon is deposited on a Si surface with essentially native oxide.

Region 7 in this case has a very low resistance and, thus, Beta is low at approximately 50–60. Because the interfacial oxidation is essentially uncontrolled, Beta is found to be highly variable from lot to lot using the horizontal polysilicon deposition process.

In the second type of known process used, the polysilicon layer over the emitter may be deposited using a vertical chemical vapor deposition (CVD) polysilicon deposition tube in which the Si region of the emitter may be oxidized in situ, typically after an initial wet preclean. In this case, a batch of wafers may be loaded into the furnace, the chamber evacuated and then a mixture of an inert gas and oxygen may be leaked into the chamber at temperatures of approximately 600° C. In this case, Beta can be set to 100.

However, different technologies of Bipolar transistors typically require different levels of interfacial oxide and, thus, need to be run separately. Also, variation of the level of oxidation across a batch of wafers can occur. In addition, the typical cost issues associated with batch versus single wafer processing are encountered.

SUMMARY OF THE INVENTION

The present invention addresses these and other problems by providing a process for forming at least one interface region between two regions of semiconductor material. The process includes forming at least one region of dielectric material comprising nitrogen in the vicinity of at least a portion of a boundary between the two regions of semiconductor material, thereby controlling electrical resistance at the interface.

Additionally, the present invention provides semiconductor devices prepared according to the above process.

Furthermore the present invention provides a semiconductor device including a region of a first semiconductor material, and a region of a second semiconductor material. An interface region including at least one region of at least one dielectric material comprising of nitrogen is arranged in the vicinity of at least a portion of the boundary between the first region of semiconductor material and the second region of semiconductor material thereby controlling electrical resistance at the interface.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

DESCRIPTION OF THE DRAWINGS

The above-mentioned objects and advantages of the present invention will be more clearly understood when considered in conjunction with the accompanying drawings, in which.

DESCRIPTION OF THE INVENTION

Figure 1:
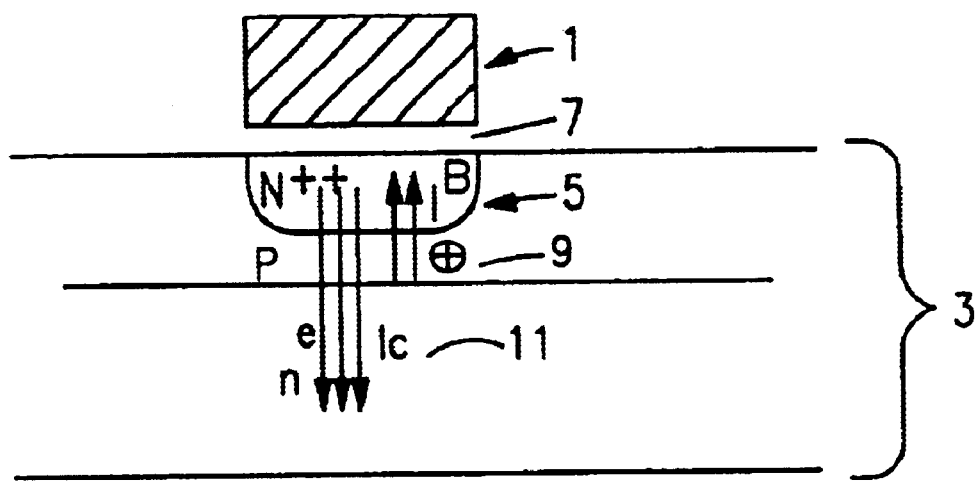
FIG. 1 represents a cross-sectional view of a NPN bipolar transistor.

In order to control the base current and, thus, beta value of a polycrystalline silicon emitter based bipolar transistor, resistance at the interface between the polycrystalline silicon emitter and monocrystalline silicon substrate typically must be tightly controlled. The present invention controls base current, beta, and resistance through at least one region of dielectric material between the polycrystalline silicon emitter and the monocrystalline substrate. The dielectric material according to the present invention typically includes nitrogen. As described in greater detail below, the nitrogen may take a variety of forms.

In fact, the present invention is not limited to use at a boundary between monocrystalline and polycrystalline silicon. In fact, the present invention may be utilized at any interface between two regions of semiconductor material. The two regions of semiconductor material could include monocrystalline silicon, polycrystalline silicon, and/or amorphous silicon.

Examples of applications of the present invention include BiCMOS devices (bipolar transistors and FET devices on the same chip). Along these lines the present invention may be utilized with heterojunction and homojunction bipolar transistors, DRAM cells, and any semiconductor device structure that includes amorphous silicon or polycrystalline silicon or SiGe or other materials are deposited on monocrystalline silicon or SiGe.

As stated above, the dielectric material between the two regions of a semiconductor material typically includes nitrogen. The nitrogen may be in any form. For example, the nitrogen could be in the form of implanted N+ or deposited N from a gaseous environment containing $N_2O$, $NH_3$, and/or NO forming $Si_xN_y$ (a silicon nitride) and/or $Si_xO_yN_z$ (a silicon oxynitride).

The thickness of the nitrogen containing dielectric region (s) as well as the percentage of the boundary between the two regions of semiconductor material that the region(s) of dielectric material covers may vary depending upon the embodiment. Typically, the thickness and extent of the dielectric region(s) may depend upon the desired base current, resistance, and/or beta value it is desired that the final structure have.

According to the present invention, the dielectric region (s) may have a thickness of from about 1 Å to about 10 Å. The thickness may be measured with an elipsometer. The thickness may be in addition to native oxide film also measured with an elipsometer. Described in other terms, the dielectric material may be film having a thickness of less than one monolayer to a plurality of monolayers. A thickness of less than one monolayer indicates that the film does not entirely cover the boundary between the regions of semiconductor material.

The dielectric material could also be arranged in a single monolayer that covers the entire boundary between the two regions of semiconductor material. Some embodiments may include a plurality of monolayers. According to such an embodiment, regions may exist where no dielectric material is deposited between the regions of semiconductor material while in other regions, a plurality of layers of semiconductor material may be arranged between the regions of semiconductor material. Also according to such embodiments, some regions of the dielectric material may include a plurality layers while other regions include a fewer or greater layers of dielectric material.

The dielectric material may also include at least one oxide. Along these lines, references made to U.S. patent application Ser. No. 09/165,946 for "beta control using a rapid thermal oxidation", the entire contents of the disclosure which is hereby incorporated by reference.

Figure 3A:
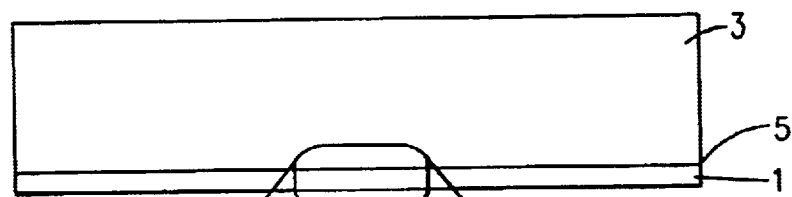
FIG. 3a represents a cross-sectional view of a portion of an embodiment of a semiconductor device structure according to the present invention.

FIG. 3a illustrates an example of a structure that the present invention may be utilized with. FIG. 3a illustrates a region of monocrystalline silicon 1, a region of polycrystalline silicon 3 and an interface 5 between the region of monocrystalline silicon and polycrystalline silicon.

Figure 3B:
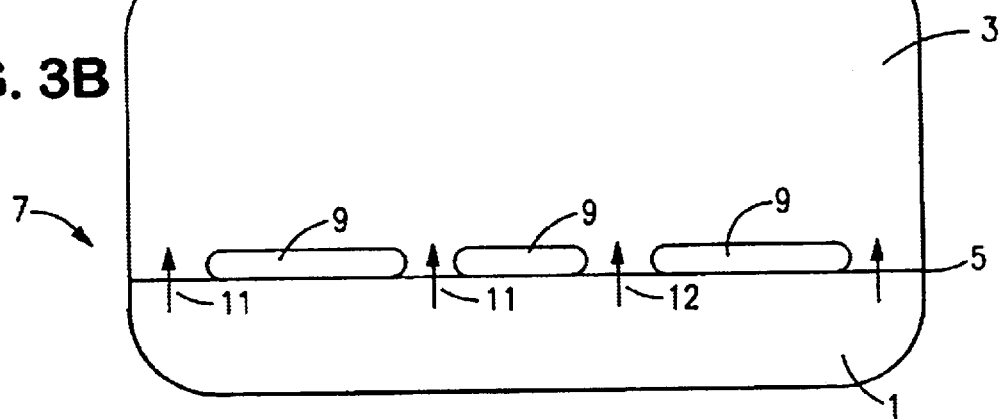
FIG. 3b represents a close-up cross sectional view of a portion of the embodiment of a semiconductor device according to the present invention as illustrated in FIG. 3a[.]

FIG. 3b illustrates a close-up cross sectional view of a portion of the structure illustrated in FIG. 3a including a plurality of regions of dielectric material between the two regions of semiconductor material. As such, FIG. 3b illustrates a portion of a structure showing an example of an embodiment of the structure according to the present invention. Along these lines, FIG. 3b illustrates a boundary region 7 including a plurality of regions 9 of dielectric material between the region of monocrystalline silicon 1 and the region of polycrystalline silicon 3. Arrows 12 represent current flowing between the regions of semiconductor material.

Figure 2:
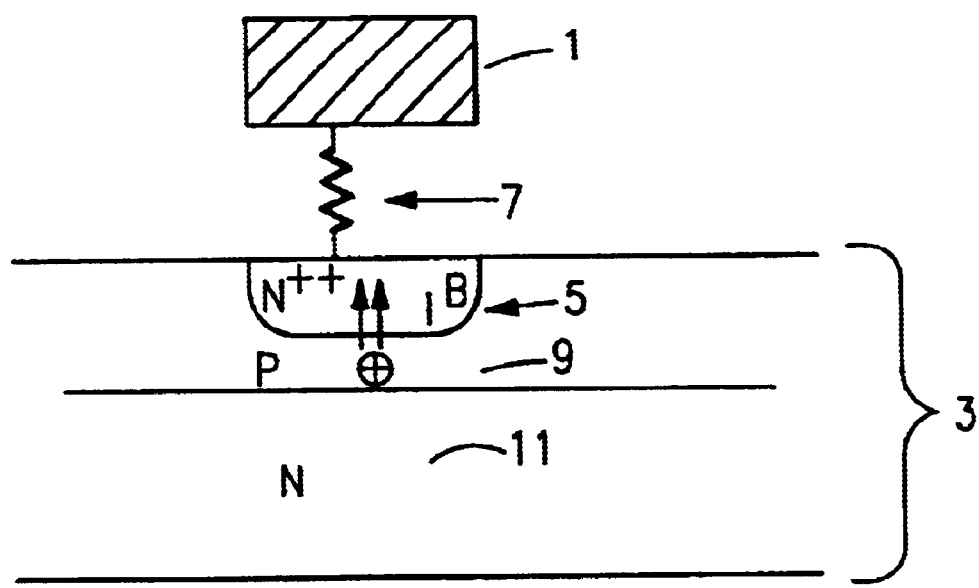
FIG. 2 represents a combined schematic and cross-sectional view of the embodiment of the transistor illustrated in FIG. 1.

The present invention provides a solution to the above problems by providing a process to control deposition of region 7 in a structure such as the transistor illustrated in FIGS. 1 and 2. The processes and resulting structures may also be utilized in other applications. It just happens that the process of the invention is particularly useful in transistors such as those shown in FIGS. 1 and 2.

By controlling the composition and physical characteristics of region 7, it follows that the present invention permits control of the value of beta in the resulting structure. The present invention accomplishes these and other objects by providing a process for creating a region of the material to form regions 7 in the structure illustrated in FIGS. 1 and 2.

According to one embodiment, the present invention provides a rapid thermal oxidation (RTO) process. The rapid thermal oxidation process is utilized to form a layer of oxide on the surface of the emitter 5 illustrated in FIGS. 1 and 2. The rapid thermal oxidation may be controlled to create oxide on at least of a portion of the emitter. In other words, it is not necessary that the oxide cover the entire emitter area. One factor that may control the thickness of the oxide as well as the percentage of the emitter covered by the oxide is the desired value of beta, which as stated above may be affected by the thickness of the oxide layer.

Among the variables that may be controlled in the rapid thermal oxidation process are temperature and time. According to one embodiment, the rapid thermal oxidation process is carried out at about 500° C. The rapid thermal oxidation process may be carried out for about 5 seconds. An embodiment of a process according to the present invention included rapid thermal oxidation carried out at about 500° C. for about 5 seconds resulted in formation of an oxide layer having a thickness of about 6A. This oxide thickness includes about 4A of native oxide plus about 2A of oxide formed by the rapid thermal oxidation process. The resulting structure has a beta value of about 100. Without this process, the interface oxide was not well controlled and the resulting Beta value was at the low end of the process specification at a value of 60.

As referred to above, the silicon dioxide or oxide thickness described herein are defined as oxide that is thermally grown plus the native oxide already present on the wafer. For instance, after a preclean, a monocrystalline Si surface may include 5 Å of native oxide as measured with an ellipsometer commonly used for semiconductor manufacturing. After subjecting this wafer to the rapid thermal oxidation process described herein, the oxide may measure 7A. In this case, the oxide thickness is defined as a thermally grown oxide of 2A in addition to or plus (+) native oxide of 5 Å.

According to one example of the present invention, prior to deposition of the emitter polysilicon in bipolar transistor processing, the emitter monocrystalline silicon surface may be precleaned with some type of HF chemistry. Such chemistry is well know to those of ordinary skill in the art and, therefore, is not discussed further here. One of ordinary skill in the art could determine appropriate treatment including HF to utilize without undue experimentation.

All oxides may be removed from the surface of a monocrystalline silicon substrate such that only native oxide due to exposure of the silicon to the atmosphere remains on the silicon. At this time, typically, an oxide is grown on the surface of the monocrystalline silicon using a rapid thermal oxidation (RTO) process according to the present invention as described herein. The present invention typically results in the growth of about 1 A to about 5 A of thermal oxide. This level of thermal oxide is in addition to the native oxide present prior to the RTO process. The oxide level may be measured with an ellipsometer commonly used in semiconductor processing. Therefore, if there is approximately 8A of native oxide prior to the RTO process, the measured thickness may be about 9 A to about 13 A post RTO. After the process of the present invention, polysilicon may then deposited in a CVD reaction without any additional oxidation of the Si surface.

Figure 4:
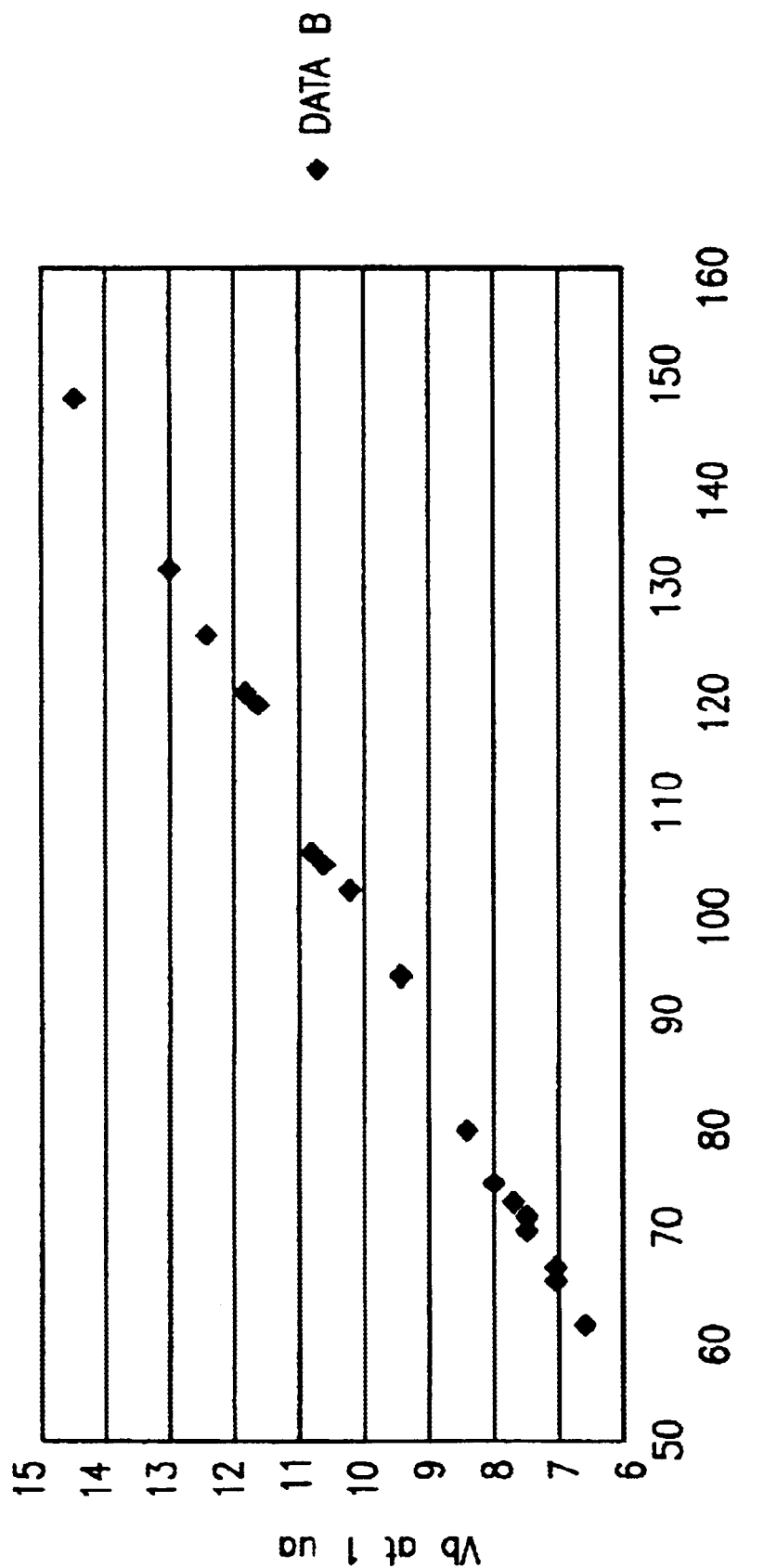
FIG. 4 represents a graph illustrating a relationship between thickness of an oxide layer formed according to an embodiment of a rapid thermal oxidation process according to the present invention with respect to temperature at which the rapid thermal oxidation process is performed.

FIG. 4 illustrates a relationship between the temperature at which the rapid thermal oxidation is carried out and the resultant thickness of the oxide layer between the emitter and the contact. As can be seen in FIG. 4, the total oxide as well as the oxide grown by the rapid thermal oxidation process both increase with increasing RTO temperature.

When polysilicon is deposited on the surface of the monocrystalline silicon substrate with different levels of thermally grown oxide as described above, the structures illustrated in FIGS. 5–7 may result.

Figure 5:
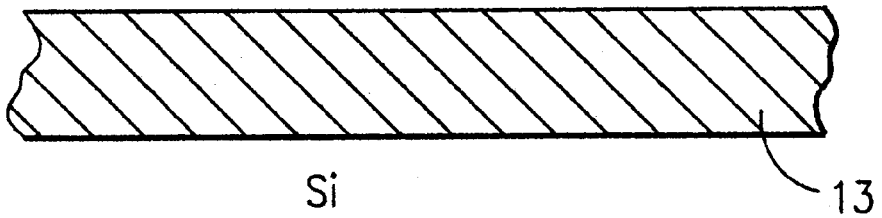
FIG. 5 represents a cross-sectional view of an embodiment of a polycrystalline silicon/monocrystalline silicon interface.
Figure 6:
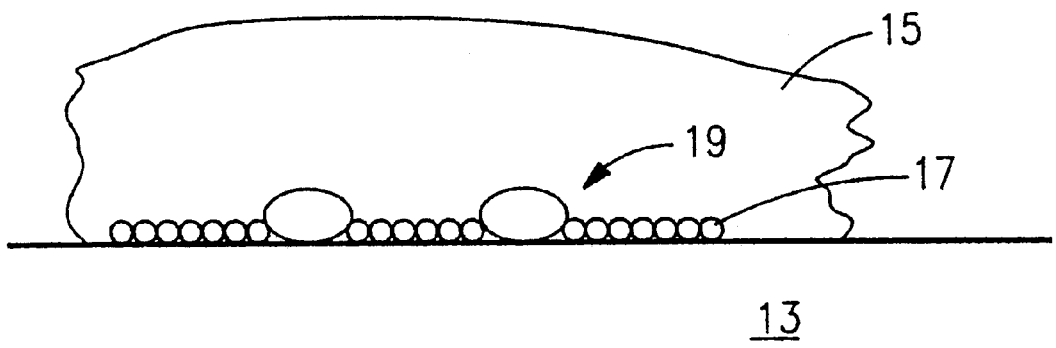
FIG. 6 represents a cross-sectional view of another embodiment of a polycrystalline silicon/monocrystalline silicon interface.

FIG. 5 shows a situation where polysilicon is deposited on a silicon surface with little oxide other than native oxide between the polysilicon and the monocrystalline silicon. The polysilicon seeds on the monocrystalline silicon base and the resulting polysilicon structure may include a significant level of epitaxially grown silicon containing many defects. In this case, the interfacial resistance is low and Beta will thus be low since the structure can result in high base current.

Where an interfacial oxide is present in range of less than about 5 A of thermally grown oxide plus native oxide, the structure illustrated in FIG. 6 results. In this case, the interfacial oxide 19 is not continuous. Where polysilicon is deposited over thin oxide, a normal polysilicon structure may result. Over the porous areas of the oxide film, the deposited silicon may be epitaxial silicon 17. In this area, there is low resistance. Because the film is discontinuous but uniform, the interface typically is very good for controlling the base current and, thus, Beta. The extreme ideal for controlling the base current and thus Beta. FIG. 6 depicts the interfacial oxide as a plurality of "islands" of oxide, 19, separated by regions 17 of epitaxial silicon.

Figure 7:
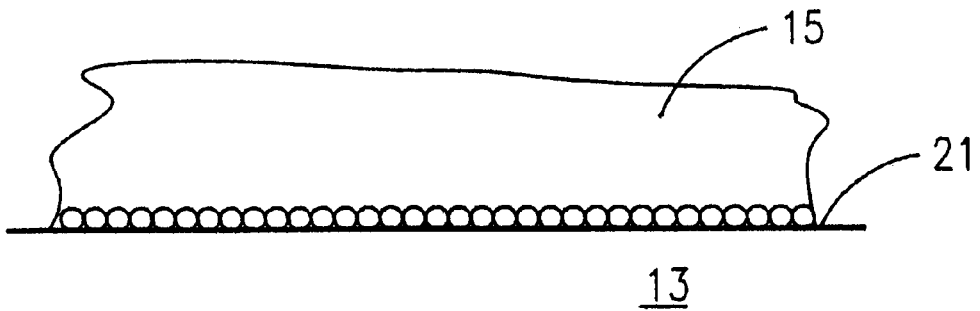
FIG. 7 represents across-sectional view of an additional embodiment of a polycrystalline silicon/monocrystalline silicon interface.

FIG. 7 illustrates an extreme case, where polysilicon is deposited on a monocrystalline silicon surface with a continuous oxide. The resulting film is entirely polysilicon with higher resistance than those described above. Thus, this structure results in high Beta.

A rapid thermal oxidation process according to the present invention may be carried out in a rapid thermal processor. Rapid thermal processors are devices that can heat substrates rapidly to a target temperature or temperatures, maintain the substrates at the target temperature(s), and cool the substrates rapidly from the target temperature(s). These devices are often used in semiconductor manufacturing where wafers are placed through thermal processes. A rapid thermal processor can heat wafers at rates of about 5° C. to about 400° C./sec, with about 30° C./sec being typical. These processors can cool wafers at rates of about 5° C. to about 100° C./sec, with about 30° C./sec being typical.

Typically, rapid thermal processors are single wafer processors. In other words, they do not process batches of substrates or wafers simultaneously. Instead, they process one wafer at a time through a prescribed thermal cycle. Because of this, the chamber of a rapid thermal processor typically is small, especially in comparison to the size of the chambers of used in conventional furnace hot processing.

Additionally, rapid thermal processing systems typically are closed systems, with control of gas delivery and exhaust. Therefore, during processing, gas concentrations may easily be controlled. For example, oxygen concentration may be controlled during processing at levels of from about 100% pure O2 down to about 10 ppm O2.

According to the process of the present invention, a layer of $SiO_2$ or other oxide layer may be formed over the monocrystalline semiconductor. The oxide layer may be described as a monolayer or less. Less than a monolayer indicates that not all of the surface of the monocrystalline semiconductor is covered with oxide. Less than a monolayer indicates the layer is discontinuous. FIG. 3 illustrates the discontinuous layer of the present invention. FIG. 3 depicts the oxide layer as comprising a plurality of isolated regions 19. These isolated regions 19 may be termed "islands."

One significant advantage of the present invention is that it can produce a very repeatable oxide layer. In other words, the coverage and thickness of the oxide on the surface of the monocrystalline semiconductor are very repeatable according to the present invention.

As described above, the thickness of oxide created by the rapid thermal oxidation according to the present invention may vary depending upon the temperature, time, pressure, and/or oxygen concentration at which the rapid thermal oxidation is carried out. Increasing the temperature, time, pressure, or oxygen concentration will have the effect of increasing the thickness of oxide grown. Several different temperature ranges may be included in various embodiments of the present invention. For example, the invention may be carried out at a temperature less than about 700° C.

Selecting the target temperature of the rapid thermal process at least partially determines the thickness of the oxide layer grown. The specific electrical needs of a particular semiconductor device will determine what thickness of oxide is required. A Depending upon the desired electrical characteristics of the devices being created, an extended range of temperatures may be used. Rapid thermal processes within the temperature ranges described herein can result in anywhere from complete coverage of the monocrystalline semiconductor to partial coverage of the monocrystalline semiconductor.

According to one embodiment of the present invention, a device may perform optimally with rapid thermal oxidation at a temperature of about 450° C. Another device may require a rapid thermal oxidation at a temperature of about 475° C. A typical range for rapid thermal oxidation processing according to the present invention is about 450° C. to about 500° C. However, processing at less than about 450° C. may result-obtaining lower beta values. Processing above about 500° C. may permit higher beta values to be obtained.

When temperatures in the vicinity of about 700° C. are utilized, the resulting oxide layer may have a thickness of about 5 Å to about 10 Å. Alternatively though reductions in time, pressure, or oxygen concentration the oxide thickness may be no greater than about 5 Å. Alternatively, the oxide layer may have a thickness of about 2 Å to about 4 Å or from about 2 Å to about 3 Å when utilizing lower temperature processes. The specific thickness of oxide created may be determined by the rapid thermal oxidation process used, including manipulating the variables discussed herein.

As stated above, when a subsequent polycrystalline and/or amorphous semiconductor layer is deposited upon the semiconductor substrate, there is a tendency for the initial atoms of that added semiconductor layer to bond to the substrate with the monocrystalline pattern or orientation of the substrate. This is commonly referred to as epitaxial growth. The layer created by the present invention may provide a layer that reduces the tendency of that added semiconductor to deposit or grow epitaxially, or with the monocrystalline pattern of the substrate.

In the past, the problem of formation of single crystal semiconductor or monocrystalline semiconductor from polycrystalline and/or amorphous semiconductor was solved by oxidizing the surface of the monocrystalline semiconductor by bleeding $O_2$ gas or air in the polycrystalline semiconductor low-pressure chemical vapor deposition furnace. However, this method is known not to produce reliably repeatable results. Additionally, an $O_2$ or air bleed in a furnace does not permit all wafers to receive the same oxide monolayer or fractional oxide layer. Furthermore, the $O_2$ or air bleed typically results in a reduced number of fractional wafers in the furnace load. Also, in furnace processing with the air or $O_2$ bleed, processing each wafer to with its own specific process is not possible. In the single wafer rapid thermal oxidation process, each wafer or lot of wafers may receive a different rapid thermal oxidation process, if wafer in a batch or lot of wafers may receive a different rapid thermal oxidation process, if desired, allowing wafers to intentionally, and controllably reach a range of performance values.

Rather than an oxide layer, the layer between the monocrystalline semiconductor and polycrystalline and/or a amorphous semiconductor may be more broadly described as an electrically insulating material. The electric insulating material could be an oxide. However, it could also be a nitride and/or a nitridized oxide.

According to one embodiment of the present invention, the at least one region of dielectric material is arranged on a sidewall of a trench formed in a monocrystalline silicon substrate. The trench is filled with non-monocrystalline silicon. Typically, the trench is filled with polycrystalline silicon or amorphous silicon in which some crystallization has taken place.

The placement of the region(s) of dielectric material relative to the interface region may depend upon the environment as well as the method utilized for creating the region(s) of dielectric material. According to one embodiment, the atoms or molecules of dielectric material may be implanted within one of the regions of semiconductor material. In other words, the atoms or molecules of dielectric material may be implanted within one or both of the regions of semiconductor material.

The atoms and/or molecules may be implanted under the surface of one or both of the regions of semiconductor material or at the surface of one or more of the regions of semiconductor material. According to one example, the dielectric material includes nitrogen atoms implanted in the monocrystalline silicon. According to other embodiments, the dielectric material is deposited on a surface of one of the regions of semiconductor material, such as the monocrystalline silicon discussed above.

After forming the region(s) of dielectric material, the other region of semiconductor material may then be deposited or formed on the monocrystalline substrate and the dielectric region(s).

The present invention also includes processes for forming at least one interface region between two regions of semiconductor material. The method includes forming at least one region of dielectric material including nitrogen in the vicinity of at least a portion of a boundary between two regions of semiconductor material. The at least one region of dielectric material may be formed in a variety of ways.

According to one example, the at least one region of the dielectric material may be formed by implanting the dielectric material in the vicinity of the surface of one of the regions of semiconductor material. The dielectric material may be implanted in one region of dielectric material prior to formation of the other region of semiconductor material.

According to one example, the dielectric material is created by implanting low doses of the dielectric material. Low doses may be desirable to help ensure that a discontinuous layer of dielectric is formed to result in the desired control of base current. According to one example, low levels of nitrogen are implanted.

The energy with which the nitrogen or other material(s) is implanted may be low enough such that the material(s) is/are not implanted too deep in the semiconductor material. According to one example, in which low levels of nitrogen are implanted as the dielectric material, the nitrogen is implanted at energies less than about 2 KeV. Typical implant energies may be in a range of about 0.1 KeV to about 5 KeV. The dosages of nitrogen utilized in this example may be in a range of from $1 \times 10^{11}$ to $1 \times 10^{14}$.

After implanting the dielectric, an additional anneal process may be performed. The anneal process may be desirable to supplement the implantation process. For example some hot processes may not be adequate to form the discontinuous Si—N layer near the surface of the monocrystalline silicon.

According to one example, the anneal process may be a rapid thermal anneal. A rapid thermal anneal may be carried out at a temperature of about 900° C. to about 1100° C. for a time of about 1 second to about 60 seconds. Such a rapid thermal anneal may be used to form $Si_xN_y$ (a silicon nitride) and/or $Si_xN_yO_z$ (a silicon oxynitride)

An advantage of implanting the dielectric material as described above is that photomasks may be utilized for tailoring implant conditions by region or device. On the other hand, a blanket film could be implanted in a region of semiconductor material. Residual dielectric may be removed after deposition and etching of the second layer of semiconductor material. For example, nitrogen could be implanted in the monocrystalline silicon as a blanket film. A residual material could be removed postpoly-Si deposition and etch.

According to a second example of a method according to the present invention for forming the region(s) of dielectric material, one of the regions of semiconductor material may be subjected to elevated temperatures and a nitrogen-containing gaseous atmosphere. The gaseous atmosphere could include at least one $N_2O$, NO, and/or $NH_3$ gases. The temperature that the process may be carried out at could be anywhere from about 300° C. to about 1,000° C. The semiconductor may be exposed to these temperatures and gases for a time period of about 1 to about 60 seconds.

Exposing a monocrystalline substrate to such an atmosphere and such a temperature for such a time, creates a discontinuous film on the surface of the monocrystalline silicon. The film may include silicon nitride and/or silicon oxynitride. However, the composition of the film may depend upon the nitrogen containing gas utilized in during the process as well as the temperature and time period that the process is carried out for.

The dielectric material created and the characteristics of the film created may also depend upon the semiconductor material that is exposed to the process of the invention. If the semiconductor material is monocrystalline silicon, then the dielectric material may be silicon nitride or silicon oxynitride if exposed to the above gases at the above process parameters.

If the semiconductor material exposed to this second embodiment of a process according to the present invention for forming a dielectric layer is monocrystalline silicon, the process may be carried out after cleaning. The cleaning may be a wet process, plasma process, or reducing hot process.

Regardless of the material that the process is carried out on and the process materials, the process for carrying out the formation of the dielectric layer may be a rapid thermal process, fast thermal process (FTP), or conventual furnace process. A rapid thermal process typically is a rapid process carried out with quartz lamps. A fast thermal process typically is a small batch process that utilizing a conventional furnace. A conventional furnace typically utilizes a quartz tube with a ceramic cover and is heated resistively.

During this second example of a process according to the present invention, the substrate may be exposed to the elevated temperatures according to a variety of regimens. For example, the substrate may be exposed to the full elevated temperature immediately. Alternatively, the temperature that the substrate is exposed to may be ramped up over a period of time.

According to one example, the temperature that the substrate is exposed to is ramped up at a rate of about 75° C. per second to a temperature of about 400° C. to about 800° C. The rate that the temperature may be ramped up may be about 5° per second to about 100° C. per second.

According to the example in which the temperature is ramped up at a rate of about 75° C. per second, ammonia gas may flow into the container that the process is being carried out in at a rate of about 5 standard liters per minute (SLPM) for a time of about 5 seconds to about 15 seconds.

After exposing the substrate to elevated temperatures, regardless of whether the temperatures are ramped and the final temperature, the substrate may then be cooled. The substrate may be cooled actively or passively. Along these lines, the process may include some intervention for increasing the rate of coaling beyond what would be experienced in simple convection of heat from the substrate. to one example, the substrate is cooled at a rate of about 15° C. to about 30° C. per second.

After cooling, the substrate may be extracted from a processing chamber or other space where the process is carried out.

The process according to the second example may result in a dielectric layer having a thickness of about 1 Å to about 10 Å, when measured elipsometrically. However, process parameters may be controlled to produce dielectric layer or layers of any desired thickness and percentage of area coverage of the boundary between the two regions of semiconductor material.

After forming the dielectric region(s) through exposure to temperatures and nitrogen containing gas, the second region of semiconductor material may be provided on the first region of semiconductor material and the dielectric region (s). The dielectric region(s) may remain through deposition of the second region of semiconductor material. Any residual dielectric material or any dielectric material that is desired to be removed may be removed after or during etch of the second region of semiconductor material.

third example of a process according to the present invention may be utilized for forming a dielectric region in the vicinity of a boundary between two regions of semiconductor material includes a very thin chemical vapor deposition process. The chemical vapor deposition process may vary from embodiment to embodiment. According to one embodiment, a low pressure chemical vapor deposition process (LPCVD) may be utilized. Another embodiment utilizes a plasma enhanced chemical vapor deposition (PECVD) process.

Regardless of the chemical vapor deposition process utilized, this third example of a process for creating a region(s) of dielectric material may be utilized to create a discontinuous film on one of the regions of semiconductor material. For example, the chemical vapor deposition process may be utilized to create a discontinuous film on monocrystalline silicon that may serve as an emitter in a semiconductor device.

The chemical vapor deposition process may utilize a silicon source gas. One example of a silicon source gas that may be utilized with a CVD process according to the third example of the present invention is silane and/or dichlorosilane (DCS). Other silicon source gases may also utilized in a chemical vapor deposition process.

The chemical vapor deposition process may also utilize a nitrogen/oxygen source gas. The nitrogen/oxygen source gas may vary, depending upon the embodiment. Examples of nitrogen/oxygen source gases may include $NH_3$ and $N_2O$.

If both oxygen and silicon source gases are utilized in the CVD process, the ratio of silicon source gas to nitrogen/ oxygen source gas may vary to achieve a desired silicon-nitrogen/oxygen stoichiometry. The flow and ratio of these gases may also vary depending upon the characteristics of the layer or layers of dielectric material that it is desired to create.

The ratio of gases in the CVD processes may be controlled to utilize various ratio proportions to produce voids.

The process parameters of the chemical vapor deposition process utilized may vary depending upon, among other things, the desired characteristics of the dielectric region(s) that is desired to create and the gases that are being utilized. Typically, the chemical vapor deposition is carried out at a temperature of about 600° C. to about 800° C. The gas flow may also vary depending upon the embodiment. Typically, the deposition gases may flow for a time less than about 5 seconds.

A chemical vapor deposition process such as described herein may be utilized to create a film of a thickness with less than one monolayer. The film may have a thickness of about 1 to about 10 Å.

As stated above, regardless of the process utilized for creating the dielectric region(s), the dielectric material may be deposited on a sidewall of trench formed in a monocrystalline silicon substrate, with the trench subsequently being filled with polycrystalline silicon.

The dielectric region(s) may also include at least one oxide as also described above.

The present invention also includes a device prepared by a process such as the process described above.

Advantages of the present invention include that by utilizing implantation, the present invention may allow tailoring of beta by specific region or device. Additionally, an oxynitride interfacial dielectric may be more robust with subsequent thermal processing in a DRAM structure. Furthermore, a nitride-containing dielectric region may not be consumable by subsequent hot processes. The present invention also allows a high degree of control of NPN-β in polysilicon emitters. A nitrogen containing dielectric region (s) also help reduce retention defects in trench DRAM buried strap processes.

The present invention may also include a rapid thermal anneal (RTA) when an N implant is utilized to form an Si-N species. The rapid thermal anneal is described above in greater detail.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A process for forming at least one discontinuous interface region between two regions of semiconductor material, the process comprising:

forming at least one region of dielectric material comprising nitrogen in the vicinity of at least a portion of a boundary between the two regions of semiconductor material, wherein said dielectric material is in the form of a plurality of islands, thereby controlling electrical resistance at the interface.

2. The process according to claim 1, wherein the two regions of semiconductor material each are selected from the group consisting of monocrystalline silicon, polycrystalline silicon, amorphous silicon, monocrystalline SiGe and polycrystalline SiGe.

3. The process according to claim 1, wherein a first of the two regions of semiconductor material is monocrystalline silicon and a second of the regions of semiconductor material is non-monocrystalline silicon.

4. The process according to claim 3, wherein the second region of semiconductor material is amorphous silicon.

5. The process according to claim 1, wherein the dielectric material is N, $Si_xN_y$, or $Si_xO_yN_z$.

6. The process according to claim 1, wherein forming the at least one region of dielectric material comprises:

subjecting a first of the regions of semiconductor material to a elevated temperatures and a nitrogen-containing gaseous atmosphere.

7. The process according to claim 6, wherein the gaseous atmosphere includes at least one gas selected from group consisting of $N_2O$, NO or $NH_3$.

8. The process according to claim 6, wherein the first region of semiconductor material is subjected to temperatures of about 300° C. to about 1000° C.

9. The process according to claim 6, wherein the first region of semiconductor material is subjected to the elevated temperatures and gaseous atmosphere for a time of about 1 second to about 60 seconds.

10. The process according to claim 6, wherein the at least one region of dielectric material includes a discontinuous film of silicon nitride, or silicon oxynitride.

11. The process according to claim 6, wherein the first region of semiconductor material is monocrystalline silicon.

12. The process according to claim 6, wherein exposing the first region of semiconductor material to the elevated temperatures includes ramping the temperature up a process temperature.

13. The process according to claim 12, wherein the temperature is ramped up at a rate of about 5° C. per second to about 100° C. per second to a temperature of about 400° C. to about 800° C.

14. The process according to claim 12, wherein subjecting the first semiconductor material to a gaseous atmosphere includes subjecting the first semiconductor material to a $NH_3$ gas flowing at a rate of about 5 SLPM for about 5 to about 15 seconds.

15. The process according to claim 6, further comprising:

ramping down the temperature to ambient temperature after subjecting the first semiconductor material to elevated temperature.

16. The process according to claim 15, wherein the temperature is ramped down at a rate of about 15° C. to about 30° C. per second.

17. The process according to claim 12, further comprising:

ramping down the temperature to ambient temperature subjecting the first semiconductor material to elevated temperature.

18. The process according to claim 6, wherein the process creates a discontinuous layer of dielectric material having a thickness of about 1 Å to about 10 Å on the first region of semiconductor material.

19. The process according to claim 6, further comprising:

depositing a second region of semiconductor material on the first region of semiconductor material.

20. The process according to claim 18, further comprising:

removing portions of the dielectric material at least one of during and after deposition of the second region of semiconductor material.

21. The process according to claim 6, wherein the first region of semiconductor is exposed to elevated temperatures and nitrogen-containing gaseous atmosphere by a rapid thermal process or a conventional furnace process.

22. The process according to claim 1, wherein the at least one region of dielectric material is deposited on a sidewall of a trench.

23. The process according to claim 1, wherein the dielectric material further comprises at least one oxide.

24. A semiconductor device prepared by a process comprising:

forming at least one region of dielectric material in the vicinity of at least a portion of a boundary between the two regions of semiconductor material, wherein said dielectric material is in the form of a plurality of islands, thereby controlling electrical resistance at the interface, the dielectric material including nitrogen.

25. A semiconductor device, comprising:

a region of a first semiconductor material;

a region of a second semiconductor material; and an interface region including at least one region of dielectric material comprising nitrogen in the vicinity of at least a portion of a boundary between the first region of semiconductor material and the second region of semiconductor material, wherein said dielectric material is in the form of a plurality of islands, thereby controlling electrical resistance at the interface.

26. The semiconductor device according to claim 25, wherein the first region of semiconductor material and the second region of semiconductor material are selected from the group consisting of monocrystalline silicon, polycrystalline silicon, amorphous silicon, polycrystalline SiGe and monocrystalline SiGe.

27. The semiconductor device according to claim 25, wherein a first of the two regions of semiconductor material is monocrystalline silicon and a second of the regions of semiconductor material is non-monocrystalline silicon.

28. The semiconductor device according to claim 27, wherein the second region of semiconductor material is amorphous silicon.

29. The semiconductor device according to claim 25, wherein the dielectric material is N, silicon nitride, or silicon oxynitride.

30. The semiconductor device according to claim 25, wherein one of the regions of semiconductor material is monocrystalline silicon and the dielectric material includes nitrogen atoms implanted in the monocrystalline silicon.

31. The semiconductor device according to claim 25, wherein the at least one region of dielectric material is a discontinuous film.

32. The semiconductor device according to claim 31, wherein the film is silicon nitride or silicon oxynitride.

33. The semiconductor device according to claim 31, wherein the film of dielectric material has a thickness of about 1 Å to about 10 Å.

34. The semiconductor device according to claim 31, wherein the film of dielectric material has a thickness of less than one monolayer.

35. The semiconductor device according to claim 25, wherein the at least one region of dielectric material is arranged on a sidewall of a trench in monocrystalline silicon, the trench being filled with non-monocrystalline silicon.

36. The semiconductor device according to claim 25, wherein the dielectric further comprises at least one oxide.

* * * * *